United States Patent [19]

Sato et al.

[11] Patent Number: 5,393,374
[45] Date of Patent: Feb. 28, 1995

[54] METHOD OF ASHING

[75] Inventors: Junichi Sato, Tokyo; Shingo Kadomura, Kanagawa, both of Japan

[73] Assignee: Sony Corporation, Japan

[21] Appl. No.: 111,919

[22] Filed: Aug. 26, 1993

[30] Foreign Application Priority Data

Aug. 31, 1992 [JP] Japan .................. 4-255790

[51] Int. Cl.⁶ .................. H05H 1/00; H01L 21/00
[52] U.S. Cl. .................. 156/643; 156/646; 156/651; 156/668; 134/1
[58] Field of Search .............. 156/643, 646, 668, 651, 156/345; 134/1

[56] References Cited

U.S. PATENT DOCUMENTS

| | | | |
|---|---|---|---|
| 4,816,638 | 3/1989 | Ukai et al. | 156/345 X |
| 4,938,839 | 7/1990 | Fujimura et al. | 156/668 X |
| 4,980,022 | 12/1990 | Fujimura et al. | 156/643 |
| 5,030,319 | 7/1991 | Nishino et al. | 156/643 X |
| 5,226,056 | 7/1993 | Kikuchi et al. | 156/646 X |
| 5,240,556 | 8/1993 | Ishikawa et al. | 156/345 X |

*Primary Examiner*—Thi Dang
*Attorney, Agent, or Firm*—Ronald P. Kananen

[57] ABSTRACT

A method of ashing comprises the steps of cooling the work to a temperature of 0° C. or therebelow and causing ashing of a photo-resist on the work. An apparatus for ashing comprises a cooling ashing chamber, a heating ashing chamber, and a gate valve provided between the two chambers. The method and apparatus as noted solves prior art problems and permits photo-resist which has heretofore been difficult to remove to be removed as well and readily and with satisfactory productivity.

5 Claims, 7 Drawing Sheets

METHOD OF ASHING

BACKGROUND OF THE INVENTION

1. Field of the Invention

This invention relates to a method of and an apparatus for ashing away a photo-resist of a work. The invention is applicable to, for instance, photo-resist separation in a semiconductor integrated circuit manufacture process and, particularly, is suitably applicable for satisfactorily separating a photo-resist after high dose ion implantation without leaving a residue or the like.

2. Description of the Relevant Art

For the photo-resist separation in semiconductor processes, a commonly termed dry ashing process, which utilizes $O_2$ plasma, has become extensively adopted in mass production sites as well as in place of a wet process using fuming nitric acid or sulfuric acid hydrogen peroxide (i.e., a blend solution of sulfuric acid and hydrogen peroxide).

The basic mechanism of the dry ashing process is to remove photo-resist, which comprises an organic polymer, by ashing the photo-resist into CO and $CO_2$ through a combustion reaction caused by providing O radicals, $O_2$ radicals, and so forth, generated in plasma. The process permits comparatively ready separation of the usual photo-resist materials.

However, there are cases where it is difficult to remove photo-resist material. For example, photo-resist after ion implantation can not always be readily separated. Particularly, the problem is significant when a high dose ion implantation is necessary as in the formation of source/drain regions for super-LSI manufacture.

Where a photo-resist is used as an ion implantation mask, high dose, high energy ion implantation is made into the photo-resist as well. At this time, the photo-resist surface is hardened mainly presumably due to heat generated by the ion bombardment. The hardened layer can not be readily removed with, for instance, the usual $O_2$ plasma alone, thus extremely deteriorating the separability of the photo-resist.

It is thought that the hardened surface layer is formed not only by heat, but also in that the ion implantation dopant effects substitution in the molecular structure of the photo-resist material to cause a cross-linking reaction, the reacted portion being oxidized by $O_2$ plasma to remain as residue in a layer which is difficult to etch. Particularly, such a residue is liable to constitute a source of particle contamination to extremely reduce the yield of super-LSI or like product.

To solve this problem, a commonly termed two-step ashing process has been proposed, which comprises two steps of removing the above hardened layer in a RIE process incorporating an $H_2$ type and using ion bombardment and then carrying out ordinary ashing (Fujimura et al, "Applied Physics", spring 1989, 1P-13, p. 574). This process, however, involves an additional step and dictates an elaborate system. Further, the $H_2$ RIE process requires a long time and therefore reduces the throughput. Accordingly, further improvement of the process has been demanded.

OBJECT AND SUMMARY OF THE INVENTION

The invention seeks to provide a method of ashing, which can solve the above problems in the prior art and permits photo-resist which has heretofore been difficult to remove to be removed as well and readily and with satisfactory productivity, and an apparatus for ashing used for carrying out the same method.

According to the invention, cooling of work, as labeled as step I in FIG. 1, is first done. With the cooling of the work, the hardened film of photo-resist is also cooled down. Thus, in this step, a stress is produced in the hardened film to produce cracks therein (see cracks 2c formed in hardened film 2a of photo-resist as shown in FIG. 2B). The crack formation is promoted if a heating step (preferably a quick heating step) is also incorporated, as labeled as step III in FIG. 1. Subsequently, as ashing step, as labeled as step II in FIG. 1, is executed, in which ashing proceeds with O radicals, for instance, entering through the cracks. In this way, a satisfactory photo-resist ashing process free from residue can be realized. The hardened film that remains can be removed by a spin process or the like.

According to the invention, the process can be completed by using a system like a low temperature etching system, so that the process is not complicated.

Further, the throughput can be improved by effecting the ashing with a system which has chambers coupled to each other via a gate valve.

In a further aspect, in a cooling chamber, accumulation of the reaction by-product is liable to reduce the stability of ashing. Accordingly, the cooling chamber that has been used as such may be switched to a heating chamber for causing sublimation of sublimable deposits. By so doing, a stable process is obtainable. This permits maintenance cycle reduction to improve the productivity.

Further it is effective to incorporate a supersonic oscillation application mechanism to apply supersonic oscillation to and thereby broaden the cracks formed in the photo-resist of the work under an ashing treatment. This permits more effective photoresist removal.

According to the invention, as a specific means for the low temperature process, a method which is well known in low temperature etching may be used.

DESCRIPTION OF THE PREFERRED EMBODIMENTS

Preferred embodiments of the invention will now be described in detail with reference to the drawings. It is to be construed that the following embodiments are given for the purpose of illustration only and without any sense of limiting the invention.

EMBODIMENT 1

In this embodiment, the invention is applied to the photo-resist removal after high dose ion implantation in the manufacture of a highly finely-integrated semiconductor device.

Figure 3:
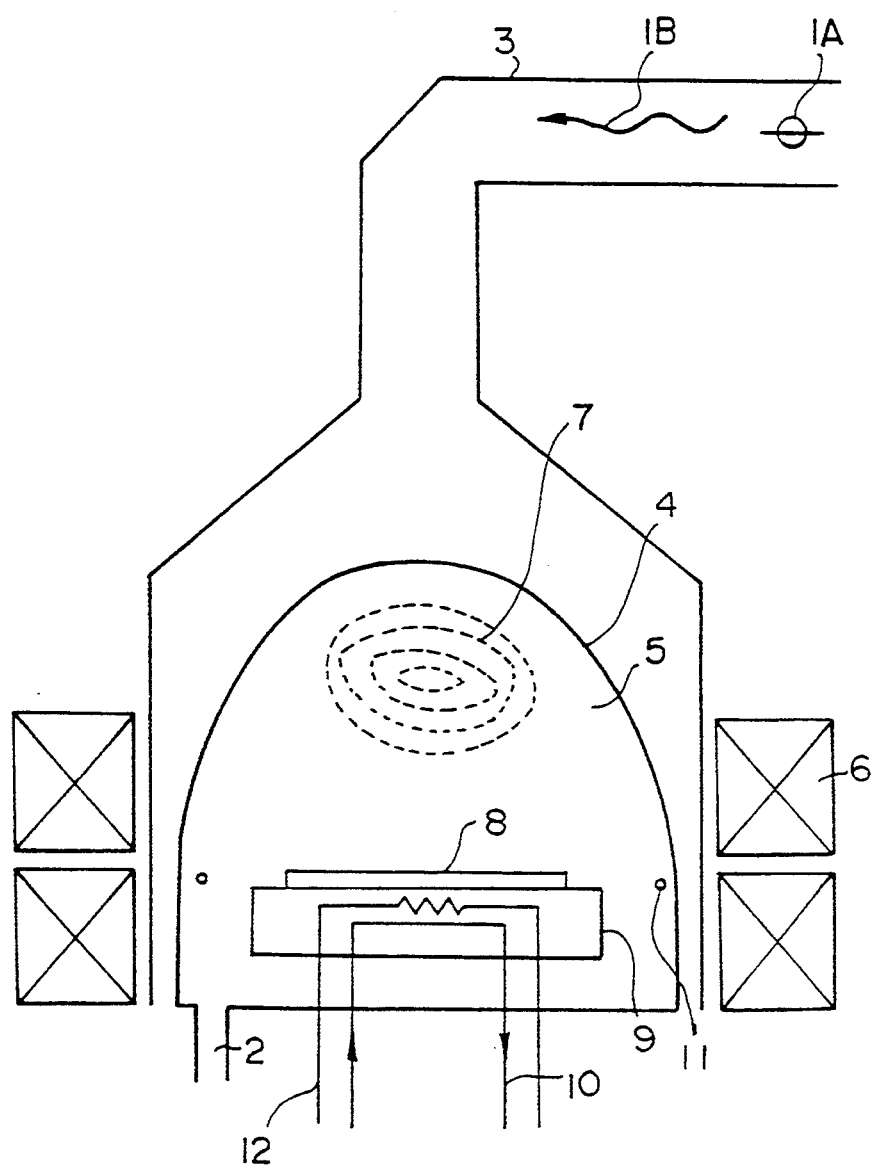
FIG. 3 is a schematic view showing an apparatus used in Embodiment 1.

FIG. 3 shows a magnetic field microwave plasma ashing system used for this embodiment. Microwave 1B generated from a magnetron 1A is led through a waveguide 3 to a reaction chamber 5 defined by a quartz chamber wall 4, and a magnetic field of $75 \times 10^{-2}$ T (tesla), which cooperates with the microwave (at a frequency of 2.45 GHz) to cause commonly termed ECR discharge, is generated by a solenoid coil 6 surrounding the reaction chamber 5. Thus, a gas plasma 7 is generated. A wafer 8 as a work is set on a susceptor 9 and is cooled from a chiller (not shown) via a cooling tube 10. Desirable susceptor temperature is less than $-10°$ C., and more desirably, less than $-20°$ C. Gas is introduced through a gas supply tube 11 and discharged through a discharge tube (not shown). In the susceptor 9; a heater 12 is buried as heating means to quickly heat the wafer 8. It is of course possible to use an IR lamp for heating.

Figure 1:
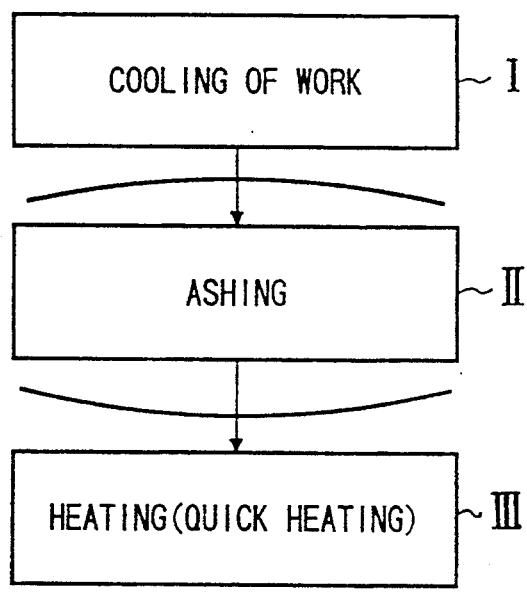
FIG. 1 is a flow chart illustrating the step of the invention.
Figure 2A:
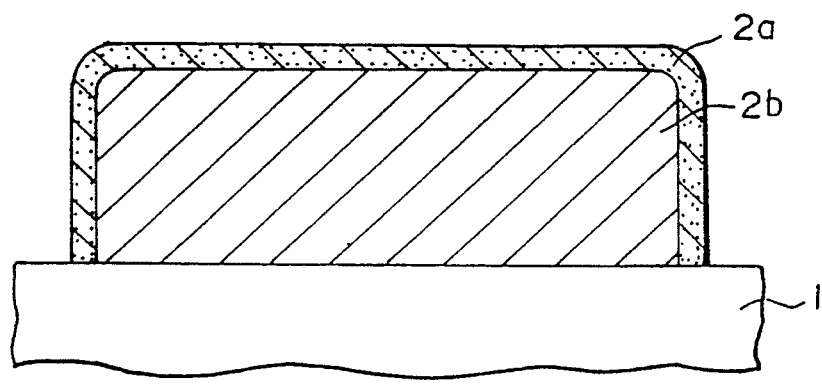
FIGS. 2A to 2D are sectional views of a work during respective steps of Embodiment 1.

In this embodiment, the invention was applied to a process of photo-resist separation after ion implantation. FIG. 2A shows the work (i.e., wafer substrate 1) having a photo-resist, which was formed after ion implantation of As+ carried out under conditions of $10^{16}/cm^2$ and 60 keV. A superficial portion of the photo-resist film 2b on the substrate 1 was denatured into a hardened film 2a. The sample was set in the plasma asher utilizing a microwave discharge as shown in FIG. 3 and subjected to ashing under the following conditions.

Gas: $O_2$, 800 sccm
Pressure: 266 Pa
Microwave power: 1 kW
Suscepter temperature: $-10°$ C.

Figure 2B:
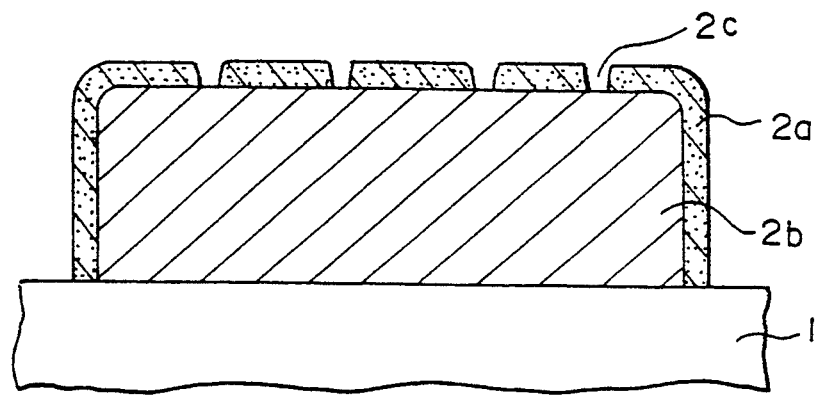
Figure 2C:
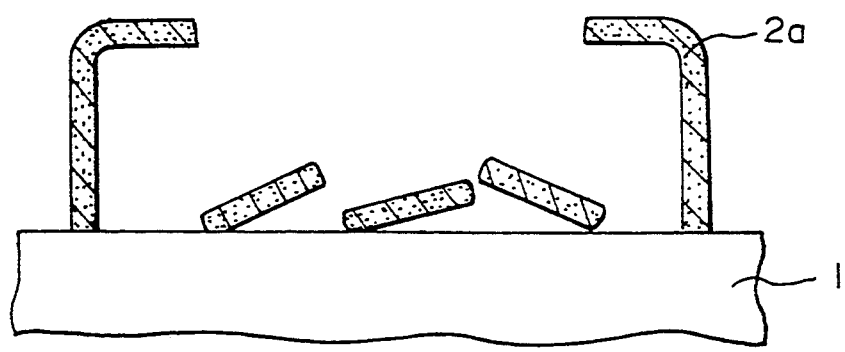
Figure 2D:

Cracks 2c as shown in FIG. 2B were formed in the hardened film 2a, and from these cracks the ashing proceeded (with introduction of radicals through the cracks), whereby the inner photo-resist was removed (FIG. 2C). Subsequently, the hardened film was removed using a spin processor, thus obtaining a clean surface as shown in FIG. 2D.

EMBODIMENT 2

The same work sample as in Embodiment 1 (as shown in FIG. 2A) was subjected to a two-step ashing process using the same asher as in Embodiment 1 (FIG. 3) under the following conditions.

Step I
Gas: $O_2$, 800 sccm
Pressure: 266 Pa
Microwave power: 1 kW
Suscepter temperature: $-10°$ C.

Then, the conditions were switched over to the following.

Step II
Gas: $O_2$, 800 sccm
Pressure: 133 Pa
Microwave power: 1 kW
Suscepter temperature: $250°$ C.

With such quick heating subsequent to cooling, sufficient cracks as shown in FIG. 2B were formed in the hardened film 2a, and with ashing proceeded from these cracks the inner photo-resist was removed (FIG. 2C). The hardened film thus ashed was subsequently removed with a spin processor to obtain a clean surface as shown in FIG. 2D).

EMBODIMENT 3

Figure 4:
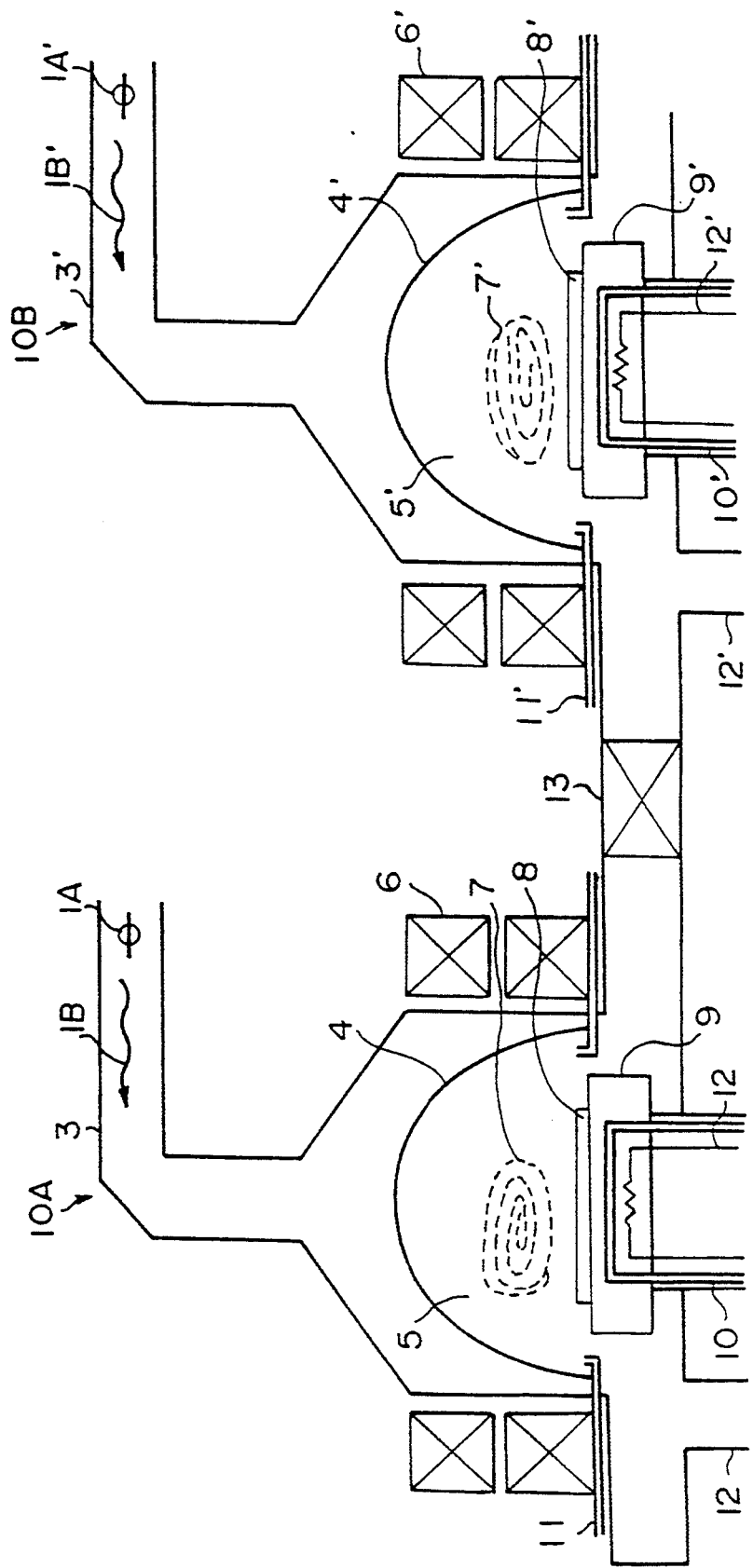
FIG. 4 is a schematic view showing an apparatus used in Embodiment 3.

In this embodiment, a microwave plasma continuous asher as shown in FIG. 4 was used as ashing equipment. In a first chamber 10A, microwave 1B generated from a magnetron 1A is led through a waveguide 3 to a reaction chamber (i.e., a pre-treatment chamber) 5 defined by a quart chamber wall 4, and a magnetic field of $8.75 \times 10^{-2}$ T (tesla), which cooperates with the microwave (at a frequency of 2.45 GHz) to cause commonly termed ECR discharge, is generated by a solenoid coil 6 surrounding the reaction chamber 5, thus generating gas plasma 7. A wafer 8 as a work is set on a suscepter 9 and cooled from a chiller (not shown) through a cooling tube 10. Gas is introduced through a gas upply tube 11 and discharged through a discharge tube (not shown). A heater 12 is buried in the suscepter 9 as heating means to quickly heat the wafer. It is of course possible to use an IR lamp or the like for heating. The first chamber 10A and a similar second chamber 10B are connected to each other via a gate valve 13. Parts of the second chamber 10B like those of the first chamber 10A are designated by like reference numerals or symbols with a dash.

In this embodiment, a work sample as shown in FIG. 2A was used. That is, in this embodiment the invention is applied to photo-resist separation after ion implantation, the work (i.e., wafer substrate 1) having photo-resist formed after ion implantation carried out under conditions of As+ carried out under conditions of $10^{16}/cm^2$ and 60 keV. The first chamber 10A of the plasma asher utilizing a microwave discharge shown in FIG. 4 was used as a cooling ashing chamber, and the sample was set in this chamber and subjected to low temperature ashing under the following conditions.

Gas: $O_2$, 800 sccm
Pressure: 266 Pa
Microwave power: 1 kW
Suscepter: $-10°$ C.

Then, the work wafer substrate 8 was transferred through the gate valve—to the second chamber 10B, and the chamber 10B was used as a heating ashing chamber for ashing under the following conditions.

Gas: $O_2$, 800 sccm
Pressure: 133 Pa
Microwave power: 1 kW
Suscepter temperature: $250°$ C.

Thus, cracks 2a as shown in FIG. 2B were formed in the hardened film 2a, and the inner photo-resist was removed (FIG. 2C). Subsequently, the hardened film was removed with a spin processor, thus obtaining a clean surface as shown in FIG. 2D.

EMBODIMENT 4

The same sample (FIG. 2A) as in the above embodiments was subjected to ashing as in Embodiment 3 using the same asher (FIG. 4) as in Embodiment 3. First, the first chamber 10A was used as a cooling ashing chamber for ashing under the following conditions.

Gas: $O_2$, 800 sccm
Pressure: 266 Pa
Microwave power: 1 kW
Suscepter temperature: $-10°$ C.

Then, the wafer structure 8 as the work was transferred through the gate valve to the second chamber 10B. Ashing was then carried out by using the chamber 10B as a thermal ashing chamber and switching the ashing conditions over to the following.

Gas: $O_2$, 800 sccm
Pressure: 133 Pa
Microwave power: 1 kW
Suscepter temperature: $250°$ C.

In this process, cracks 2c were formed in the hardened film 2a, and the inner photo-resist was removed (FIG. 2C). Subsequently, the hardened film was removed using a spin processor. In this way, a clean surface as shown in FIG. 2D could be obtained.

After processing for 100 seconds, the first chamber 10A was switched to a thermal ashing chamber while switching the second chamber 10B to a low temperature ashing chamber, and a similar process was carried out for 100 seconds. By carrying out the operation repeatedly a the maintenance time could be reduced to one half that in the prior art, and the productivity could be improved.

EMBODIMENT 5

Figure 6:
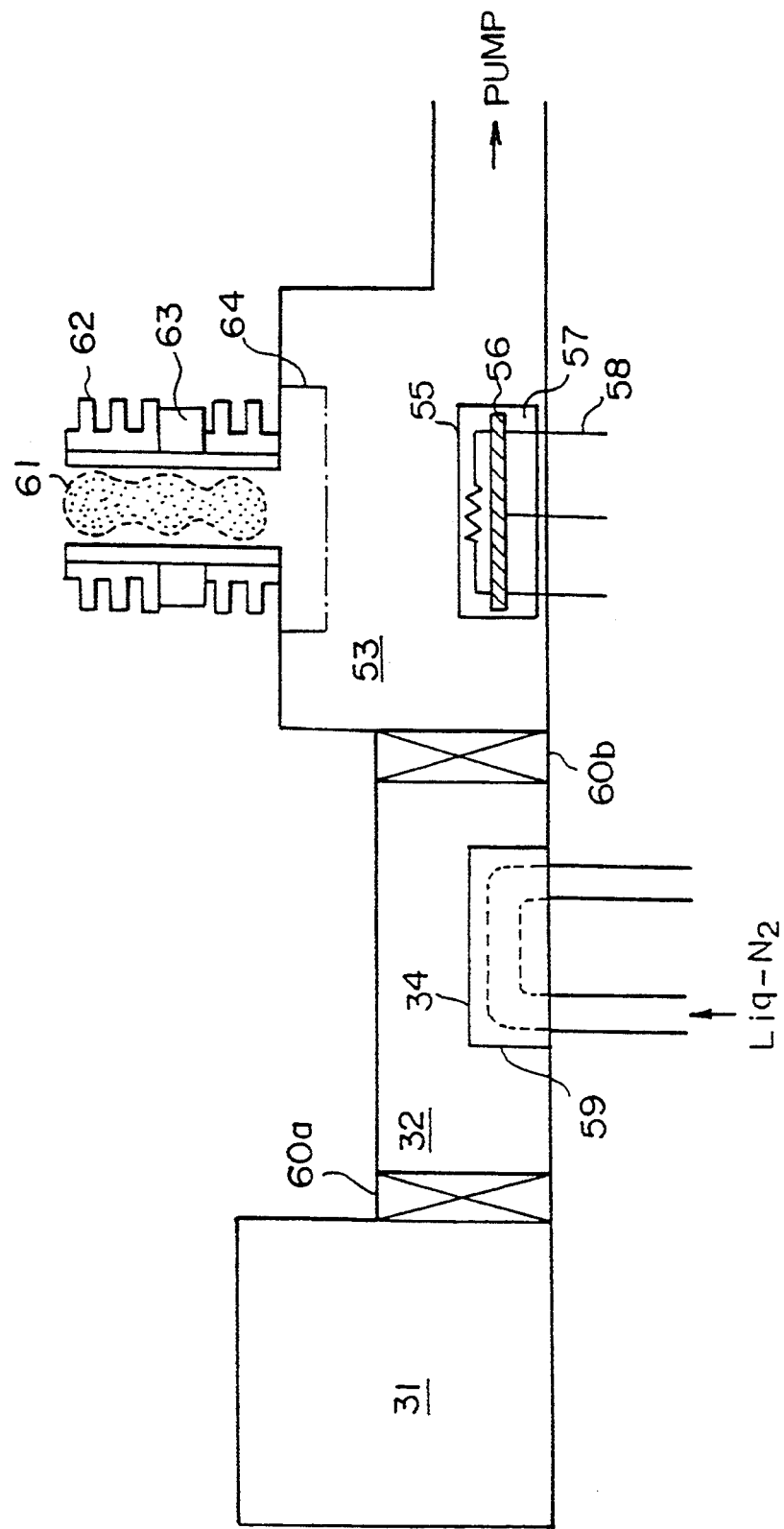
FIG. 6 is a view showing an apparatus used in Embodiment 5.

In this embodiment, an ashing apparatus as shown in FIG. 6 was used. In this apparatus, an ashing chamber 53 which is a main chamber is connected via a load lock chamber 31 and a buffer chamber 32. Gate valves 60a and 60b are each provided between the respectively adjacent adjacent chambers. In the buffer chamber 32, a wafer stage 34 is provided and exposed to liquid nitrogen circulation. The wafer as thee work thus can be cooled down to the liquid nitrogen temperature. That is, the buffer chamber wafer stage is adapted to constitute a low temperature cooling stage 59. The main chamber (i.e., ashing chamber) 53 is of a microwave down-stream type, and its wafer stage has a heater 58 as heating means. Thus, super-sonic oscillations can be provided with the heating up to 300° C. by the heater and application of DC power to an inner liquid crystal super-sonic oscillation element 56.

Figure 5A:
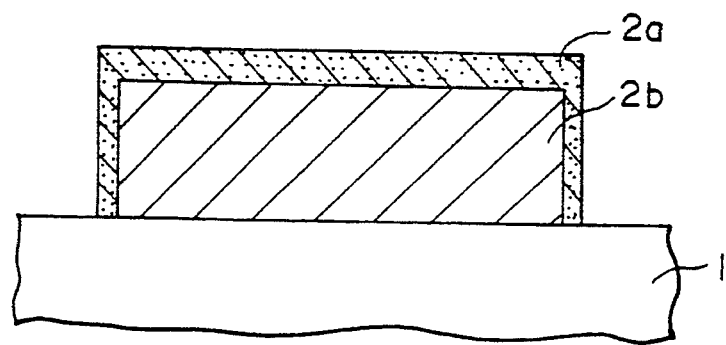
FIGS. 5A to 5E are sectional views of a work during respective steps of Embodiment 5.

In this embodiment, the invention was applied to a process of separating photo-resist 2b of a sample as shown in FIG. 5A, which was a wafer substrate 1 having the photo-resist 2b after ion implantation of As+ under coditions of $10^{16}/cm^2$ and 60 keV. The photo-resist 2b had a superficial hardened film 2a.

Figure 5B:
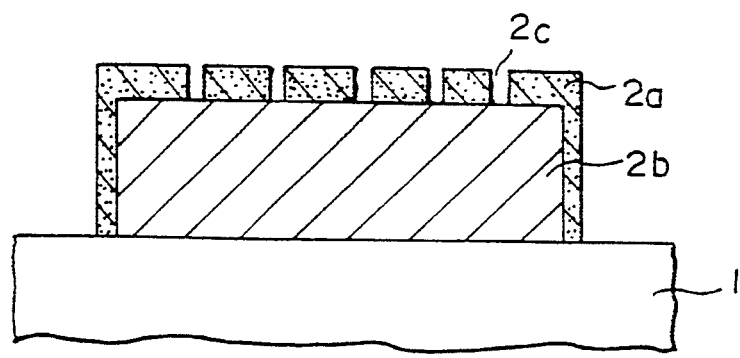

By setting the sample on the wafer stage 34 in the buffer chamber 32 in the apparatus of FIG. 6, cracks 2c were formed in the photo-resist, as shown in FIG. 5B, with an effect of super-low temperature cooling.

Figure 5C:
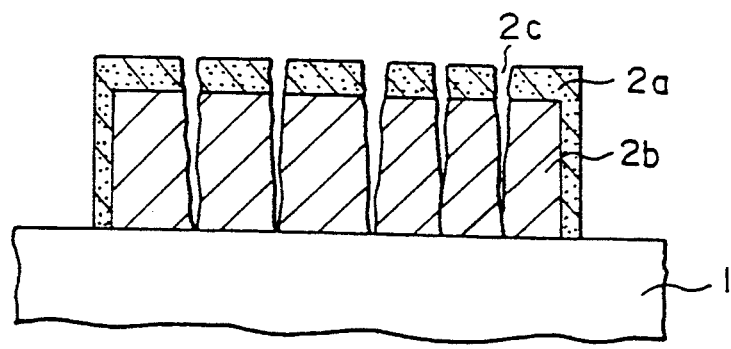
Figure 5D:
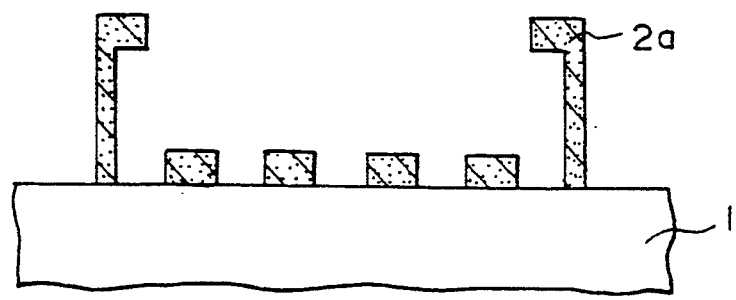

The sample in this state was transferred to the ashing chamber 53 as the main chamber of the apparatus of FIG. 6, and was subjected to ashing under the following conditions.
Gas: $O_2/N_2$, 950/50 sccm
Pressure: 133 PA
Microwave power: 1 kW
Stage temperature: 250° C.
DC power for super-sonic wave: 100 W With the super-sonic oscillation, the cracks 2c were broadened as shown in FIG. 5C. Thus, even at the elevated stage temperature, the solvent in the photoresist could be sufficiently gassified and discharged, and commonly termed hopping as a source of contamination did not occur (FIG. 5D).

Figure 5E:
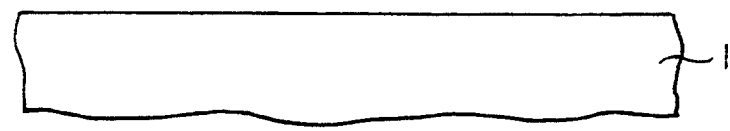

The remaining hardened film was removed in a washing step using a spin processor, thus realizing satisfactory ashing free from residue, as shown in FIG. 5E.

EMBODIMENT 6

In this embodiment, the removal of the residual hardened film was done as well in the asher. The same sample (FIG. 5A) was processed in the same asher (FIG. 6) as in Embodiment 5. The ashing was done in two steps. Step 1 was carried out in the same way as in Embodiment 5. In this step, only the hardened film 2a remained as shown in FIG. 5D with an effect of the super-sonic wave to broaden the cracks. The resultant work was processed under the following conditions.
Gas: $O_2/S_2F_2$, 950/50 sccm
Pressure: 133 Pa
Microwave power: 1 kW
DC power: 100 W
Stage temperature: 250° C.

The hardened film 2a, which contained an oxide of the dopant, was etched away in the form of $AsF_x$ with an effect of F separated from the added $S_2F_2$. (At this time, the reaction was promoted by the effect of the impressed super-sonic wave). In this way, the hardened film 2a could be ashed, thus obtaining a clean wafer surface as shown in FIG. 5E.

As has been described in the foregoing, according to the invention photo-resist, which has heretofore been difficult to remove, can be separated readily and with satisfactory productivity. For instance, it is possible to obtain residue-free removal of a photo-resist after high dose ion implantation. It is thus possible to permit manufacture of super-LSIs or the like in a stable process, with a high yield and with satisfactory productivity.

What is claimed is:

1. A method of ashing a photoresist film on a work, comprising the steps of:
   cooling the work down to a temperature of about 0° C. or therebelow, and
   then heating the work to ash the photo-resist film.

2. A method of ashing according to claim 1, wherein the step of heating after the step of cooling is performed quickly.

3. A method of ashing a photoresist film on a work, comprising the steps of
   ashing the photo-resist film while cooling the work at a temperature of about 0° C. or therebelow; and
   then increasing the temperatures during the ashing steps to remove the photo-resist.

4. A method of ashing a photoresist film on a work using an apparatus for ashing comprising a first ashing chamber for cooling said work to a temperature of about 0° C. or therebelow, a second ashing chamber for heating said work, and a gate valve provided between said first and second ashing chambers, said method comprising a step of ashing said photoresist film on said work in said individual ashing chambers alternately at least once by transferring said work through said gate valve from one chamber to the other.

5. A method of ashing a photoresist film on a work comprising the steps of using an apparatus for ashing comprising: a first cooling ashing chamber for cooling said work to a temperature of 0° C. or therebelow, a second heating ashing chamber for heating said work, and a gate valve provided between said first and second ashing chambers, and using the cooling ashing chamber as a heating ashing chamber and the heating ashing chamber as a cooling ashing chamber, thereby removing by-product generated in the ashing chamber used as the cooling ashing chamber.

* * * * *